United States Patent
Yang et al.

(10) Patent No.: US 9,478,456 B2
(45) Date of Patent: Oct. 25, 2016

(54) SEMICONDUCTOR DEVICE WITH COMPOSITE DRIFT REGION

(75) Inventors: Hongning Yang, Chandler, AZ (US); Jiang-Kai Zuo, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 875 days.

(21) Appl. No.: 13/413,440

(22) Filed: Mar. 6, 2012

(65) Prior Publication Data
US 2013/0234246 A1   Sep. 12, 2013

(51) Int. Cl.
| | |
|---|---|
| H01L 29/78 | (2006.01) |
| H01L 21/762 | (2006.01) |
| H01L 29/66 | (2006.01) |
| H01L 29/08 | (2006.01) |
| H01L 29/06 | (2006.01) |

(52) U.S. Cl.
CPC ..... *H01L 21/76224* (2013.01); *H01L 29/0847* (2013.01); *H01L 29/66659* (2013.01); *H01L 29/7835* (2013.01); *H01L 29/0653* (2013.01)

(58) Field of Classification Search
CPC .............. H01L 29/78; H01L 29/0653; H01L 29/7835; H01L 29/66659
USPC ........................................................ 257/335
See application file for complete search history.

(56) References Cited

U.S. PATENT DOCUMENTS

| | | | |
|---|---|---|---|
| 4,922,327 A | 5/1990 | Mena et al. | |
| 7,776,700 B2 | 8/2010 | Yang et al. | |
| 8,575,692 B2 | 11/2013 | Yang et al. | |
| 2006/0145250 A1* | 7/2006 | Ma | 257/336 |
| 2007/0278568 A1* | 12/2007 | Williams | H01L 21/761 257/335 |
| 2009/0001485 A1* | 1/2009 | Kim | H01L 21/26513 257/408 |

OTHER PUBLICATIONS

Jin He et al., "Linearly Graded Doping Drift Region: A Novel Lateral Voltage-Sustaining Layer Used for Improvement of RESURF LDMOS Transistor Performances," Semiconductor Science and Technology, vol. 17, pp. 721-728 (2002).

* cited by examiner

Primary Examiner — Asok K Sarkar
Assistant Examiner — Dmitriy Yemelyanov

(57) ABSTRACT

A device includes a semiconductor substrate, a channel region in the semiconductor substrate having a first conductivity type, and a composite drift region in the semiconductor substrate, having a second conductivity type. The composite drift region includes a first drift region and a second drift region spaced from the channel region by the first drift region. The device further includes a drain region in the semiconductor substrate, spaced from the channel region by the composite drain region, and having the second conductivity type. The first drift region has a dopant concentration profile with a first concentration level where adjacent the channel region and a second concentration level where adjacent the second drift region, the first concentration level being higher than the second concentration level. In some embodiments, the first and second drift regions are stacked vertically, with the first drift region being shallower than the second drift region.

18 Claims, 8 Drawing Sheets

SEMICONDUCTOR DEVICE WITH COMPOSITE DRIFT REGION

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode as a control electrode and spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor is a laterally diffused metal-oxide-semiconductor (LDMOS) transistor. In an LDMOS device, a drift space is provided between the channel region and the drain region.

LDMOS devices may be designed to operate in a high-side configuration in which all of the device terminals are level shifted with respect to the substrate potential. Devices configured for high-side operation have been applied in power switchers in DC-to-DC converters, which have respective LDMOS devices for the high side and low side. High-side capable devices may be designed to prevent a direct punch-through path from a body region of the LDMOS device to an underlying, heavily doped substrate.

LDMOS devices are often used in applications, such as automotive applications, involving operational voltages greater than 45 Volts. Breakdown resulting from applying such high voltages to the drain is often prevented through a reduced surface field (RESURF) structure of the LDMOS device design. The RESURF structure is designed to deplete the drift space of the LDMOS device in both vertical and lateral directions, thereby reducing the electric field in the PN junctions surrounding the drift region and thus raising the breakdown voltage (BVDSS) of the device.

Typically a trade-off exists between BVDSS and drain-source ON-resistance (Rdson). BVDSS determines the achievable output voltage rating for the device. Rdson determines the device area required to handle a given amount of current, e.g., the current or power rating of the device. Designing a device to achieve a higher BVDSS level (and therefore higher operating voltage) is often at the cost of increased Rdson (and thus lower current rating per unit area). For example, the BVDSS level may be increased by increasing the length of the drift space of the device or reducing the dopant concentration in the drift space, both of which increase Rdson. Conversely, designing a device to reduce Rdson (and thus increase the current rating per unit area) leads to lower BVDSS levels (and thus lower operating voltage). A reduction in Rdson that maintains a BVDSS level may be achieved by increasing device area and, thus, the manufacturing cost of the device.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Figure 1:
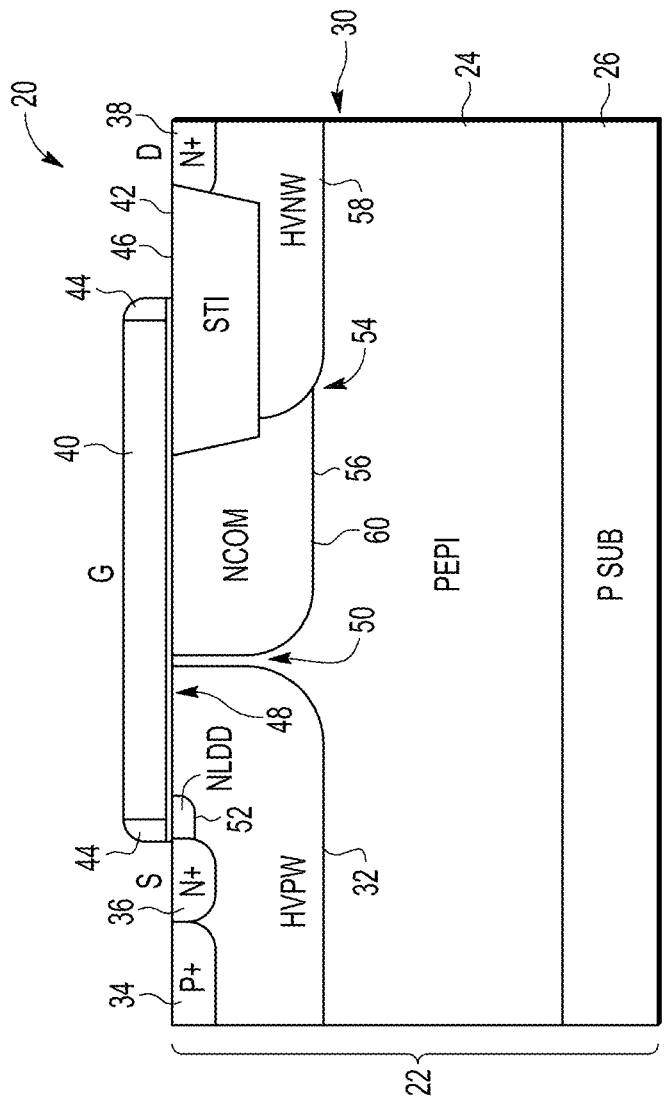
FIG. 1 is a cross-sectional, schematic view of an n-channel LDMOS transistor with a composite drift region in accordance with one embodiment.

LDMOS and other transistor devices and electronic apparatus are configured with a composite drift region. The composite drift region may include a stacked arrangement that maximizes or increases the voltage drop in the drift region. In some embodiments, first and second drift regions of the composite drift region are stacked vertically, with the first drift region shallower than the second drift region. The stacking of the first and second drift regions may alternatively or additionally be stacked laterally. The stacked arrangement may increase the breakdown voltage (BVDSS) of the disclosed devices without detrimentally affecting other device parameters. For example, the breakdown voltage may be increased while maintaining a low drain-source resistance (Rdson). In some cases, the breakdown voltage may be increased by 10-40 Volts for devices otherwise designed for breakdown voltages under 100 Volts. The resulting breakdown voltage of the disclosed devices may exceed the device operational voltage by 15-20V or more. The disclosed devices may thus be used in a variety of high voltage power switching applications, including automotive and consumer applications, which may have operating voltages of 65, 85, or 125V and, thus, benefit from breakdown voltages of, for instance, 80, 100, or 140V.

The composite drift region of the disclosed devices may also be configured to allow the drain-source resistance to be decreased without adverse effect on the breakdown voltage. The disclosed LDMOS devices and methods may thus improve or optimize both the breakdown voltage and the drain-source resistance. Such improvements may be achieved without increasing the device area.

In some embodiments, the composite drift region includes a first drift region or layer with a non-uniform dopant concentration profile. For example, the profile may have a delta-like profile. The dopant concentration may decrease with increasing depth within the first drift region. For example, the dopant concentration at or near a bottom of the first drift region may be similar to the level of the semiconductor substrate (e.g., an epitaxial layer thereof) in which the first drift region is formed. The dopant concentration may decrease to a level that does not substantially exceed compensating for the opposite dopant concentration of the substrate. The composite drift region also includes a second drift region or layer on which the first, non-uniform region or layer is stacked. The second drift region may be connected to the first drift region at or near the bottom of the first drift region. The second drift region or layer may be positioned under an isolation region, such as a shallow trench isolation (STI) region. The lateral extent of the second drift region may be pulled back to space the second drift region from a channel of the disclosed devices.

The composite drift region may effectively increase the electrical field in the drift region. The increased electrical field may arise from, for instance, the low doping level at the bottom of the first drift region. The composite drift region may thus be configured to maximize or increase the voltage dropped in the drift region of the disclosed devices. In turn, the higher dopant concentration of the first drift region at or near the surface of the substrate (e.g., at or near the channel) may establish a higher conductivity level between the channel and the second drift region. The drain-source resistance may thus be maintained at a low level.

Although described below in connection with n-channel LDMOS transistors, the disclosed devices are not limited to any particular transistor configuration. For instance, application of the features of the disclosed devices is not limited to LDMOS or other power MOS devices. One or more features of the disclosed devices may be applied to other device configurations, including, for instance, bipolar transistors. For example, the composite field drift regions of the disclosed devices may be useful in a wide variety of power electronic devices. The composite field drift regions are also not limited to any one particular type of RESURF configuration. The disclosed devices may have varying RESURF structures, including single, double, or other RESURF structural arrangements, each of which may be referred to herein as a "RESURF transistor."

For convenience of description and without any intended limitation, n-channel LDMOS devices are described and illustrated herein. The disclosed devices are not limited to n-channel devices, as p-channel and other types of devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

FIG. 1 is a schematic cross-sectional view of an example of an n-channel field LDMOS device 20 constructed in accordance with one embodiment. The device 20 is configured as a RESURF transistor as described below. The device 20 includes a semiconductor substrate 22, which may, in turn, include a number of epitaxial layers 24. In this example, the semiconductor substrate 22 includes a single p-type epitaxial layer p-epi grown on an original substrate 26 (e.g., a heavily doped p-type substrate). The device 20 may alternatively or additionally include non-epitaxial layers in which one or more device regions are formed. Any one or more of the layers of the semiconductor substrate 22 may include silicon. The structural, material, and other characteristics of the semiconductor substrate 22 may vary from the example shown. For example, the semiconductor substrate 22 may include a silicon-on-insulator (SOI) construction. Additional, fewer, or alternative layers may be included in the semiconductor substrate 22. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

An active area 30 of the device 20 is depicted in FIG. 1. One or more device isolation regions may define the active area 30. Such isolation regions may surround the active area 30. For example, one or more heavily doped n-type isolation wells or sinks (not shown) may define the periphery of the active area 30 and isolate the device 20 from adjacent devices. The semiconductor substrate 22 may additionally include one or more buried layers (not shown), such as an n-type buried layer (NBL), which may be formed in a dedicated epitaxial layer. Such buried layers may extend across (e.g., under) the active area 30 of the device 20 to act as a barrier or isolation layer separating the active area 30 from the rest of the substrate (e.g., the original substrate 26). Any number of the isolation wells, sinks, or buried layers may be connected to one another.

The device 20 includes a device body or body region 32 in the semiconductor substrate 22. The body region 32 may include a p-type well formed in the epitaxial layer 24 of the substrate 22. In this example, the p-type well is configured for high voltage operation and accordingly labeled a high voltage p-well, or HVPW. The body region 32 may be biased via a heavily doped p-type body contact region 34 formed in or otherwise above the p-type well of the body region 32 in the semiconductor substrate 22. The dopant concentration of the contact region 34 may be at a level sufficient to establish an ohmic contact to the body region 32.

The device 20 includes heavily doped n-type source and drain regions 36 and 38 in the semiconductor substrate 22. The heavily doped n-type source region 36 is disposed within the body region 32. The heavily n-type doped drain region 38 is spaced from the body region 32. The regions 36, 38 may have a dopant concentration at a level sufficient to establish ohmic contacts to bias the source region 36 and the drain region 38. In a typical LDMOS configuration, the drain region 38 is biased at a high voltage, Vds, relative to the source region 36, which may, for example, be considered to be at ground potential.

The device 20 includes a gate structure 40 formed on or above a surface 42 of the semiconductor substrate 22. The gate structure 40 is located on or above a gate dielectric (not shown). For example, the gate dielectric may include silicon dioxide (or oxide) deposited or otherwise formed on the surface 42. The gate structure 40 includes a conductive gate on or above the gate dielectric, which insulates the conductive gate from the substrate 22. The gate structure 40 may include one or more dielectric sidewall spacers 44 disposed along lateral edges of the gate structure 40. The sidewall spacers 44 may cover the lateral edges to act as a silicide blocker to prevent a silicide short along the surface 42. The sidewall spacers 44 may provide spacing to separate the conductive components of the gate structure 40 from the source region 36 and other regions of the active region 30. In this example, one of the sidewall spacers 44, located on the source side of the gate structure 40, is used for alignment purposes in defining an edge of the source region 36.

The components, materials, and other characteristics of the gate structure 40 may vary from the example shown. For instance, the gate structure 40 may include one or more additional conductive gates to form, for instance, a dual-gate device. Further details regarding examples of dual-gate structures are described in U.S. Pat. Nos. 7,608,513 ("Dual Gate LDMOS Device Fabrication Methods") and 7,795,674 ("Dual Gate LDMOS Devices").

One or more shallow trench isolation (STI) regions 46 may be formed at the surface 42 in the semiconductor substrate 22. In this embodiment, one such STI region 46 spaces the gate structure 40 from the conductive regions in the semiconductor substrate 22 in the active region 30 of the device 20. The STI region 46 may isolate the gate structure 40 from the high voltage applied to the drain region 38. Hot carrier injection into the oxide layer of the gate structure 40 may thus be avoided or minimized. The STI region 46 may also isolate other components of the device 20 from the high voltage applied to the drain region 38, including, for instance, the regions 34, 36, and 48.

When the gate structure 40 is biased, charge carriers (in this case, electrons; alternatively, holes) accumulate in a channel area or region 48 of the body region 32 under the gate structure 40. In this example, the accumulation of electrons results in a charge inversion in the channel region 48 from the p-type body region 32 to an n-type conduction layer or area near the surface 42 of the semiconductor substrate 22. Once a sufficient amount of the charge carriers accumulate in the conduction layer or area, current can flow from the source region 36 toward the drain region 38 through the channel region 48. The layer or area in which the charge carriers accumulate may be referred to as an accumulation region of the device 20.

The channel region 48 may include other regions or areas in the semiconductor substrate 22 in which charge inversion occurs as a result of the bias applied to the gate structure 40. Charge carriers may also accumulate at the surface 42 of the substrate 22 outside of or beyond the body region 32. In this example, charge carriers may accumulate in an area near the surface 42 in a region 50 of the epitaxial layer 24 adjacent the body region 32. The area of the region 50 of the epitaxial layer 24 may, in some cases, be considered to be part of the channel region 48 of the device 20. Alternatively, such regions may be considered an accumulation region of the device 20 to distinguish such regions from the channel region 48 in the body region 32. The channel region 48 and the accumulation region may form part of a conduction path or region of the device 20.

The accumulation region(s) of the device 20 need not be limited to regions in which charge inversion occurs. The accumulation region of the device 20 may include areas or regions having the conductivity type opposite than the conductivity type of the body region 32. In this example, the accumulation region may thus include an n-type region, such as a portion of an n-type field drift region (or layer or area thereof) described below.

The conduction path of the device 20 may include other regions, whether n-type or p-type, at or near the surface 42 in which conduction is enabled or enhanced via the bias voltage applied to the gate structure 40. For example, the conduction path may include one or more intermediately doped n-type transition regions 52 in the semiconductor substrate 22 at or near the surface 42. The regions 52 may provide further protection for the gate structure 40. In this example, one such n-type transition region 52 (labeled in FIG. 1 as "nldd," or n-type lightly doped drain) extends from the source region 36 under the edge of gate structure 40. The n-type transition region 52 may be a diffused region formed in connection with the source region 36. The n-type transition region 52 may help prevent hot carrier injection into the oxide or other component of the gate structure 40. Another transition region may extend from the drain region 38 toward the gate structure 40. The n-type transition region(s) 52 may assist in controlling the electric field at or near the surface 42, including in areas other than those areas near the source region 36 or the drain region 38.

The device 20 includes a composite drift region 54 in the semiconductor substrate 22. The composite drift region 54 is disposed adjacent the body region 32 to space the drain region 38 from the channel region 48 and the body region 32. The composite drift region 54 may include any number of subsidiary regions. Each subsidiary region has n-type conductivity in this example. The composite drift region 54 is configured such that the charge carriers drift under the electric field arising from the voltage applied between the drain region 38 and the source region 36. In this example, the composite drift region 54 is disposed in the epitaxial layer 24. One or more portions of the composite drift region 54 may be configured for depletion during operation to reduce the magnitude of the electric field, the reduced surface field (RESURF) effect, in various locations in the active area 30 for improved breakdown performance. The composite drift region 54 is further configured to achieve both a high breakdown voltage and low drain-source resistance (Rdson) levels by leveling the electrical field in certain locations within the composite drift region 54. In some locations, a leveled or constant electrical field may, in fact, correspond with an increase in the electrical field in certain areas relative to conventional RESURF designs.

The subsidiary drift regions of the composite drift region 54 may be disposed in a stacked configuration or arrangement. Stacking the subsidiary drift regions defines a drift path followed by the charge carriers exiting the channel region 48. The shape, depth, dopant concentration level, and other characteristics of the subsidiary drift regions vary the characteristics of the drift path over its length. Varying such characteristics may help increase the breakdown voltage and/or maintain a low drain-source resistance.

One or more of the subsidiary drift regions of the composite drift region 54 may be disposed at the surface 42 under the gate structure 40. Such subsidiary drift regions may be adjacent to, or form a part of, the channel region 48 or the accumulation region of the device 20. In contrast, one or more other subsidiary drift regions of the composite drift region 54 may be spaced from the channel region 48 and the surface 42 under the gate structure 40. In this example, the composite drift region 54 includes a first drift region 56 and a second drift region 58 spaced from the channel region 48 by the first drift region 56. One or both of the first and second drift regions 56 and 58 may be configured as a well in or on which other regions are formed or defined. In this example, the second drift region 58 is a well in which the drain region 38 is defined. The STI region 46 may also be formed in one or both of the first and second drift regions 56 and 58. In this example, the STI region 46 extends laterally across portions of both of the first and second drift regions 56 and 58 and, thus, is formed in both. The composite drift region 54 is configured such that the charge carriers from the channel region 48 drift around the STI region 46, as the charge carriers pass through the first drift region 56 to reach the second drift region 58 and, ultimately, the drain region 38. Additional or alternative regions may be formed in the one or both of the first and second drift regions 56 and 58. For example, one or more transition regions (e.g., an n-type lightly doped drain region, or NLDD region) may be formed in the second drift region 58 adjacent the drain region 38.

The first and second drift regions 56 and 58 may be stacked relative to, for instance, the channel region 48 in multiple directions (e.g., laterally and vertically). For instance, the second well drift region 58 is both laterally and vertically spaced from the channel region 48 by the first well drift region 56. The second well drift region 58 is also vertically spaced from the surface 42 of the semiconductor substrate 22 by the first well drift region 56. To achieve the vertical stacking, the first drift region 56 may be shallower than the second drift region 58. For example, the bottom of the first drift region 56 may be shallower than the bottom of the second drift region 58. The vertical stacking may additionally or alternatively be achieved by spacing the second drift region 58 from the surface 42 by the STI region 46. In this example, the first drift region 56 is shallower than the second drift region 58 despite that the first and second drift regions are laterally adjacent (e.g., connect) to one another at or near a bottom 60 of the first drift region 56. The first and second drift regions 56 and 58 may be connected under the STI region 46. As shown in FIG. 1, the first and second well drift regions 56 and 58 are not connected to one another at the surface 42 where the first drift region 56 is adjacent the channel region 48. The lateral nature of the stacking arrangement may also apply to other regions in the active area 30, such as the drain region 38. In this example, the first drift region 56 is spaced from the drain region 38 by the second drift region 58.

The first and second drift regions 56 and 58 may overlap laterally and/or vertically to an extent that varies from the example shown in FIG. 1. For example, the extent to which the first and second drift regions 56 and 58 overlap in the vertical dimension may be decreased so that the first drift region 56 has a depth roughly equal to the STI region 46, but nonetheless sufficient to establish the connection with the second drift region 58. The dopant concentration levels of the first and second drift regions 56 and 58 near the connection may also be configured to adjust the lateral overlap of the first and second drift regions 56, 58. The dopant concentrations may be set to levels to achieve a constant electrical field across the lateral extent of the composite drift region 54 as described below.

One or both of the first and second drift regions 56 and 58 may be depleted, at least in part, during operation along reverse-biased junctions with, for instance, the epitaxial layer 24 and/or the body region 32. The junctions are reverse biased as a result of the application of a drain voltage Vds between the source region 36 and the drain region 38. The reverse-biased junctions may reduce the electric field, as in the RESURF effect, for improved breakdown performance. In an alternative embodiment, the device 20 may be configured to establish a double RESURF effect, in which, for example, one or more additional regions may be disposed adjacent one or both of the first and second drift regions 56 and 58 for further depletion regions in the active area 30. Further details regarding the structural and operational characteristics of suitable RESURF regions are set forth in U.S. Pat. No. 6,882,023 ("Floating RESURF LSMOSFET and Method of Manufacturing Same").

One or more of the subsidiary drift regions of the composite drift region 54 may have a non-uniform or varying dopant concentration profile. The dopant concentration level may vary as a function of depth. In one embodiment, the first drift region 56 has a non-uniform dopant concentration profile and the second drift region 58 has a relatively uniform dopant concentration. The non-uniform dopant concentration profile of the first drift region 56 may be achieved in a variety of ways. In one example, the dopant concentration level varies gradually or continuously over the profile. For instance, the dopant concentration level may continuously decrease from a high level (e.g., $6 \times 10^{16}/cm^3$) at or near the surface 42 to a low level (e.g., $4 \times 10^{15}/cm^3$) at or near the bottom 60 of the first drift region 56, differing by about one order of magnitude or more. The dopant concentration profile may have a delta-like shape. One example of a delta-like profile includes a tail that extends to a depth beyond mere surface-level doping, the tail extending without the sharp drop-off typically found in delta profiles. Alternatively, the dopant concentration level may vary in a more discontinuous or discrete manner over the profile. For example, the first drift region 56 may thus include discrete changes in dopant concentration level at one or more depths or lateral positions. In such cases, the first drift region 56 may thus include a number of sub-regions, each having a respective dopant concentration level. The dopant concentration level of the first drift region 56 may vary in any desired combination of continuous and discrete changes.

The non-uniformity of the dopant concentration level in the first drift region 56 allows the portion of the composite drift region 54 adjacent to the channel region 48 to have a different (e.g., higher) dopant concentration level than one or more portions spaced from the channel region 48. A higher dopant concentration level in the first drift region 56 where adjacent the channel region 48 may lead to a higher conductivity between the channel region 48 and the composite drift region 54. The drain-source resistance may thus stay low. A lower concentration level in the first drift region 56 where adjacent the second drift region 58 increases the electric field in such portions of the composite drift region 54, thereby allowing the electric field to remain constant (or more constant) across the lateral extent of the composite drift region 54. The constant electric field may help avoid breakdown that would otherwise occur at a lower drain-source bias voltage at a point of maximum electric field. In some embodiments, the lower concentration level may be similar to (e.g., slightly higher than) the dopant concentration level of the epitaxial layer 24. The two levels may have a common order of magnitude (e.g., $10^{15}/cm^3$). The n-type concentration level of the first drift region 56 at this depth or position may slightly exceed and, thus, compensate for, the p-type concentration level of the epitaxial layer 24. The first drift region 56 is labeled "NCOM" in FIG. 1 to reflect the manner in which the first drift region 56 compensates for the p-type doping of the epitaxial layer 24, but not much more. In some embodiments, the lower concentration level of the first drift region 56 may be exceeded by the concentration level of the second drift region 58. The first drift region 56 may include any number of different concentration levels.

The lateral position at which the first and second drift regions 56 and 58 meet may vary from the example shown. For example, the first and second drift regions 56 and 58 need not meet at a lateral position under the gate structure 40. The extent to which the gate structure 40 overlaps one or both of the first and second drift regions 56 and 58 may vary. The lateral positioning of the STI region 46 may also vary. The first and second drift regions 56 and 58 may be shifted relative to the STI region 46 as well.

The lateral spacing of the composite drift region 54 and the body region 32 may also vary. For example, the lateral width of the gap region 50 between the first drift region 56 and the body region 32 may vary. The length of the channel region 48 may be adjusted accordingly. In some embodiments, the composite drift region 54 and the body region 32 need not be spaced from one another.

The device 20 is shown in simplified form and, thus, FIG. 1 does not show the conductive (e.g., ohmic) contacts and other metal layers configured for electric coupling with the drain region 44, the source region 46, and the gate structure 52. The device 20 may have a number of other structures or components for connectivity, isolation, passivation, and other purposes not shown in FIG. 1 for ease in illustration. For instance, the device 20 may include any number of additional isolation regions or layers. In some examples, another p-type epitaxial layer (not shown) may be configured as a p-type barrier layer. One or more STI regions, isolation trenches, and/or isolation wells (not shown) may be provided to isolate the active region 30 and/or the body region 32.

Figure 2:
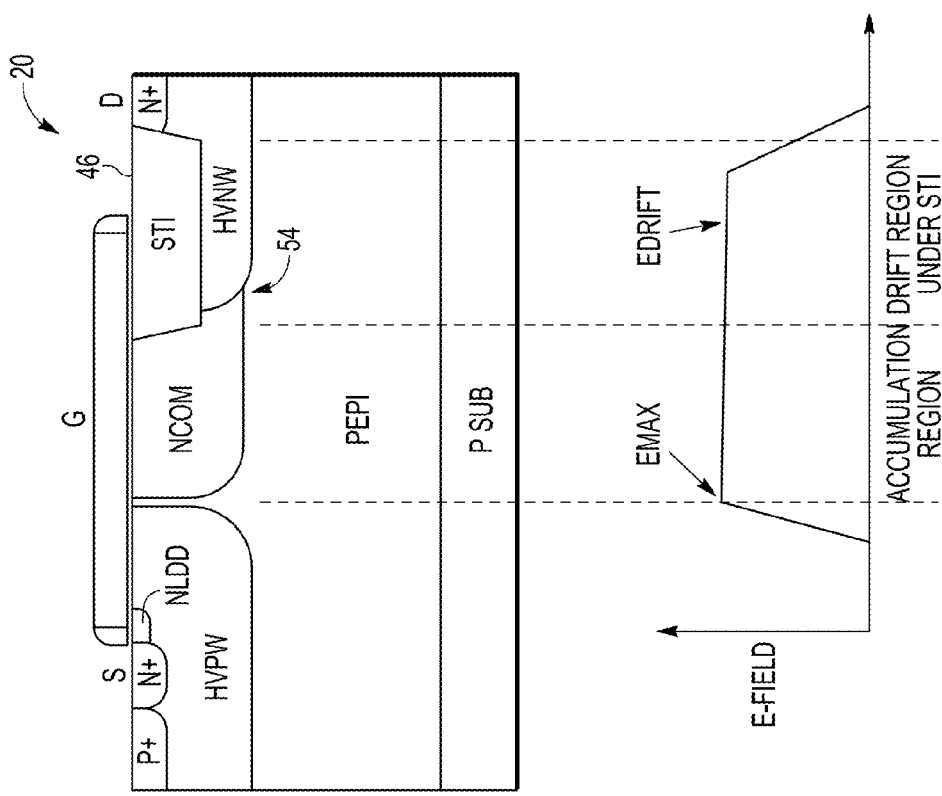
FIG. 2 is a graphical plot of the electric field in the n-channel field LDMOS transistor of FIG. 1 along a lateral line below a shallow trench isolation (STI) region.

FIG. 2 depicts the exemplary device 20 in connection with a graphical plot of the electric field distribution in the composite drift region 54. The electric field values are taken along a lateral line across the exemplary device 20, the lateral line running under the STI region from the body region, through the composite drift region 54, to the drain region. The graphical plot shows how the electric field distribution has a relatively constant magnitude (Edrift) in the composite drift region 54. While a maximum electric field magnitude (Emax) may be reached in the composite drift region 54, the distribution is more level or constant than in traditional field drift devices. As a result, the breakdown voltage may increase. With the constant distribution, breakdown may occur inside or outside of the composite drift region 54, or both at the same time. For example, the electric field may be higher outside of the composite drift region 54, such as inside the STI region 46. In contrast, breakdown occurs at the PN junction between the p-type and n-type wells in a traditional field drift LDMOS device.

Figure 3:
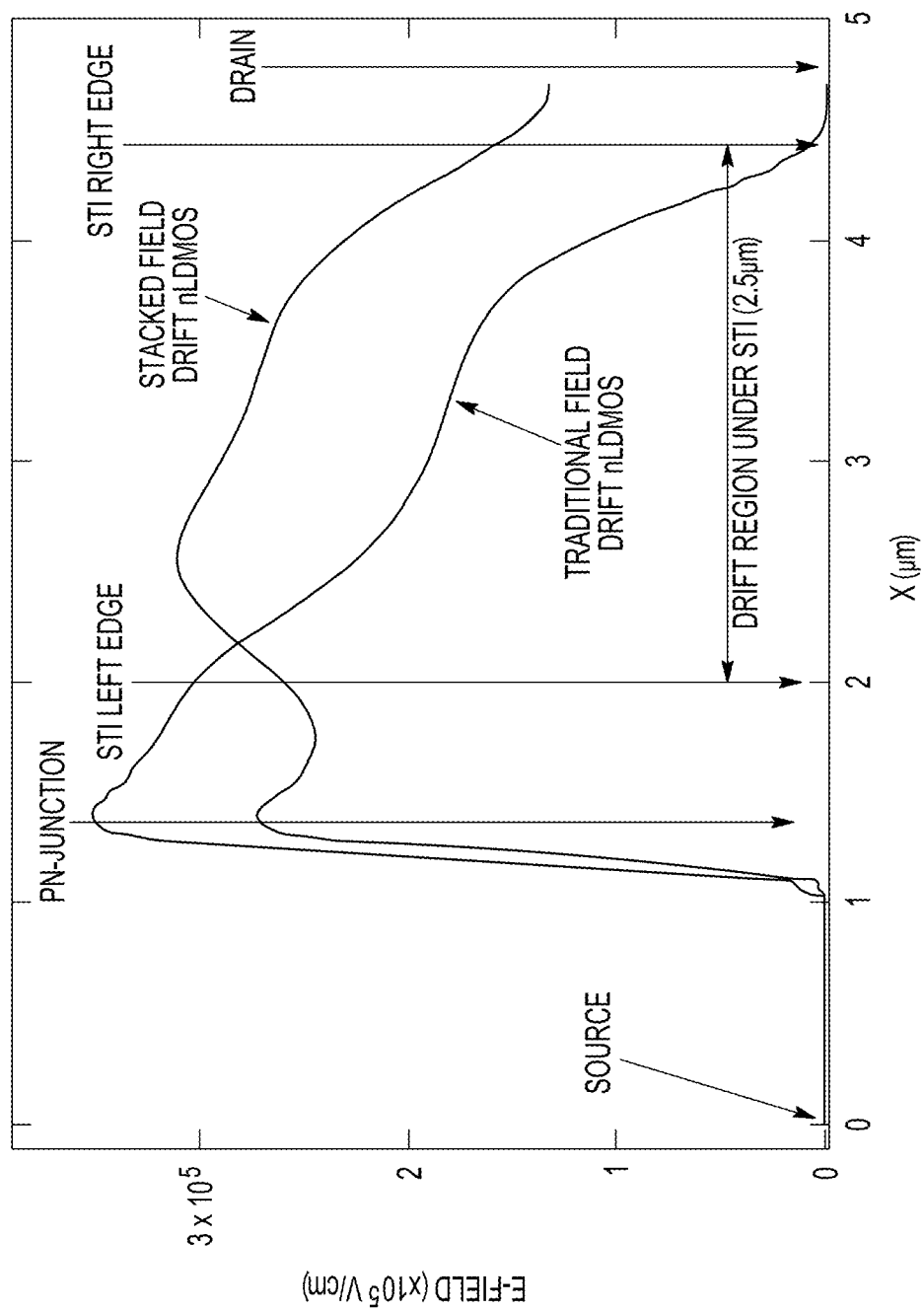
FIG. 3 is a graphical plot of simulated electric field levels in a conventional field drift LDMOS transistor and an exemplary LDMOS transistor having a composite drift region

FIG. 3 depicts a graphical plot of a simulated electrical field distribution in a simulation of one example of an LDMOS device having a stacked or composite drift region as described above. The simulation may be obtained via a Technology Computer-Aided Design (TCAD) simulation tool. In this example, the electric field reaches a maximum within the composite drift region between left and right edges of the STI region, as indicated in the plot. The distribution is relatively flat in comparison with the electric field in a traditional field drift LDMOS device, which has a maximum at the above-referenced PN junction as shown. The maximum electric field in the traditional device also has a higher magnitude than the maximum electric field in the composite field drift device.

Figures 4A, 4B:
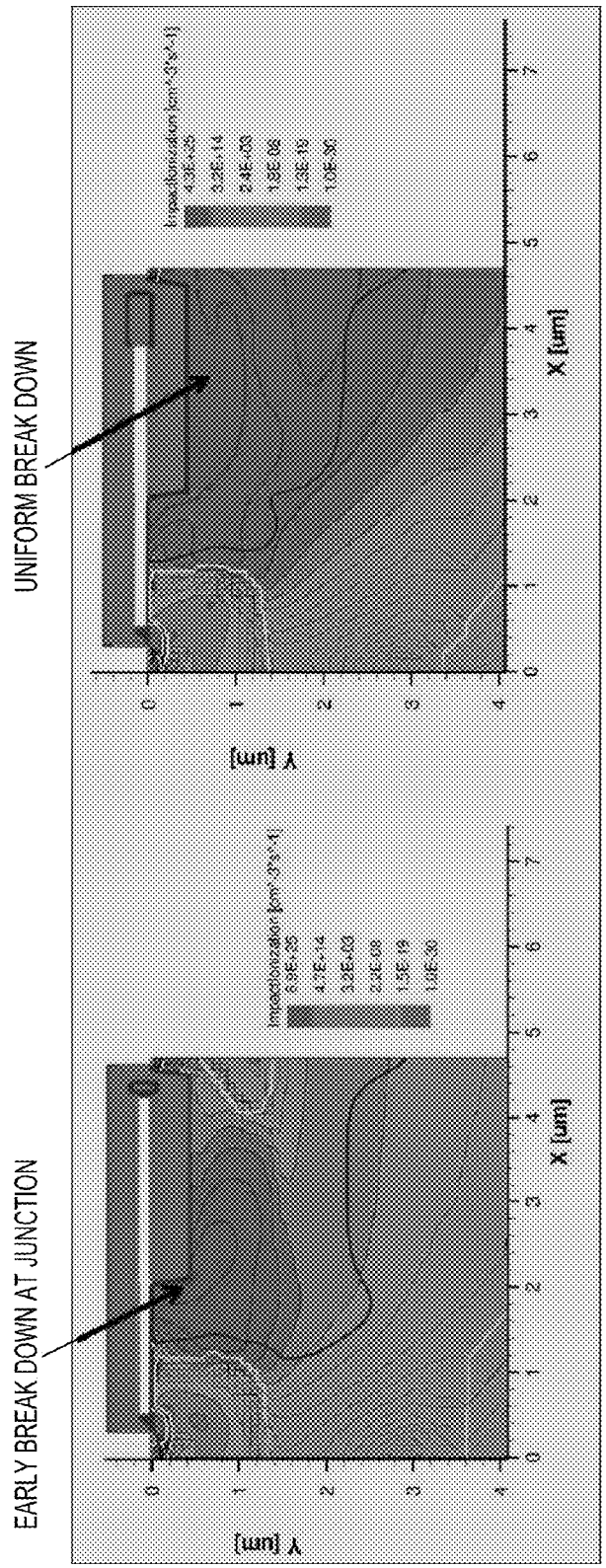
FIGS. 4A and 4B are graphical plots of simulated impact ionization levels in a conventional field drift LDMOS transistor and an exemplary LDMOS transistor having a composite drift region, respectively.

The electric field distributions shown in FIG. 3 may lead to the breakdown scenarios illustrated in FIGS. 4A and 4B. FIG. 4A depicts simulated impact ionization levels reached at the above-referenced PN junction of the traditional LDMOS device. The simulation data may be obtained via a TCAD simulation tool. Early breakdown accordingly occurs at the junction. FIG. 4B depicts the lower and more evenly spread impact ionization levels reached in one example of a device having a composite or stacked drift region. Breakdown may occur uniformly and at a higher voltage as a result.

Figures 5A, 5B:
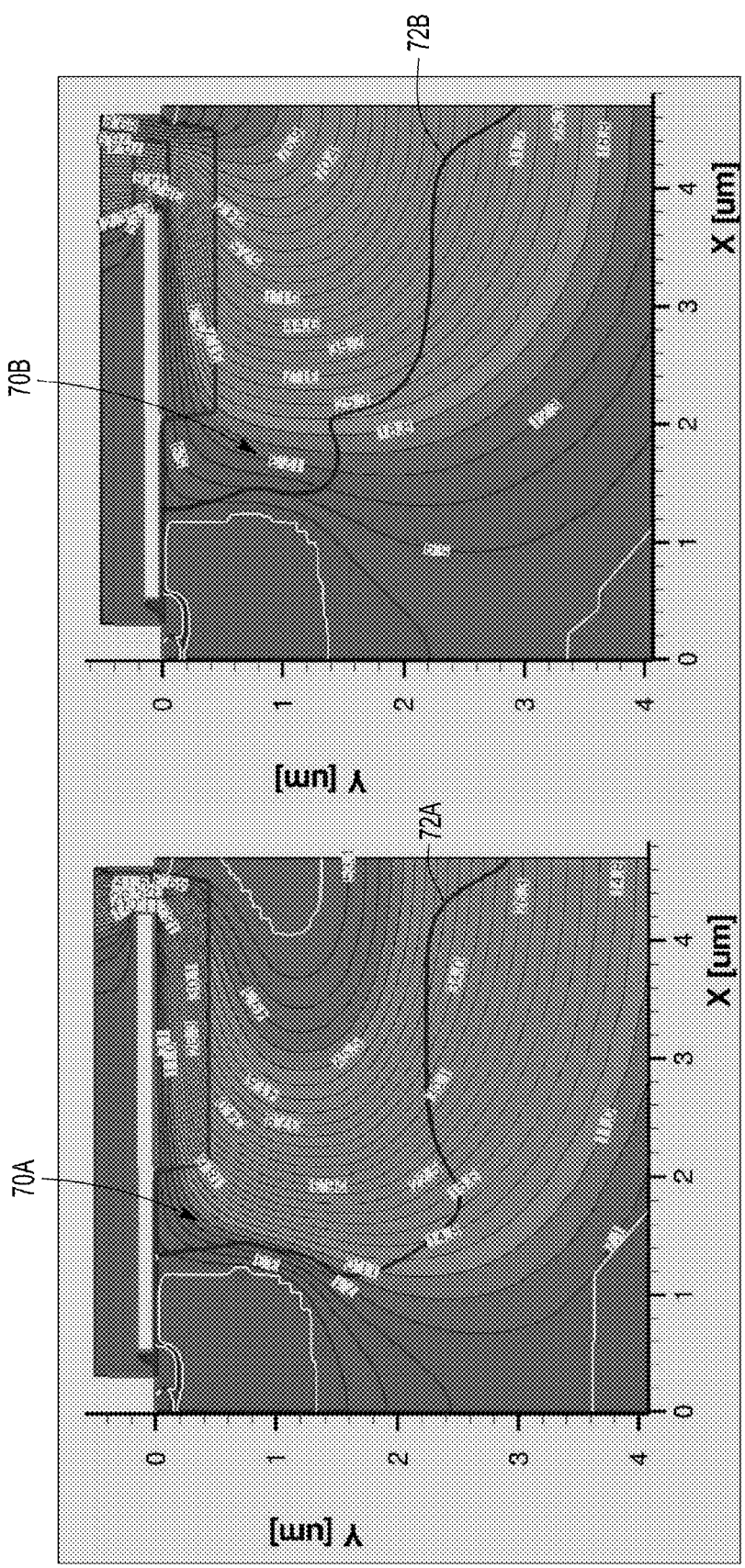
FIGS. 5A and 5B are of graphical plots of simulated equipotential lines in a conventional field drift LDMOS transistor and an exemplary LDMOS transistor having a composite drift region, respectively.

FIGS. 5A and 5B depict the equipotential lines of the two simulated devices. The higher electric field in the traditional LDMOS device near the PN junction is reflected in the densely spaced equipotential lines in region 70A (FIG. 5A). In contrast, the equipotential lines in region 70B (FIG. 5B) are less densely spaced, reflecting a lower electric field in the disclosed device. Lines 72A and 72B indicate the locations of the respective PN junctions in the two devices. The simulation data may be obtained via a TCAD simulation tool.

Figure 6:
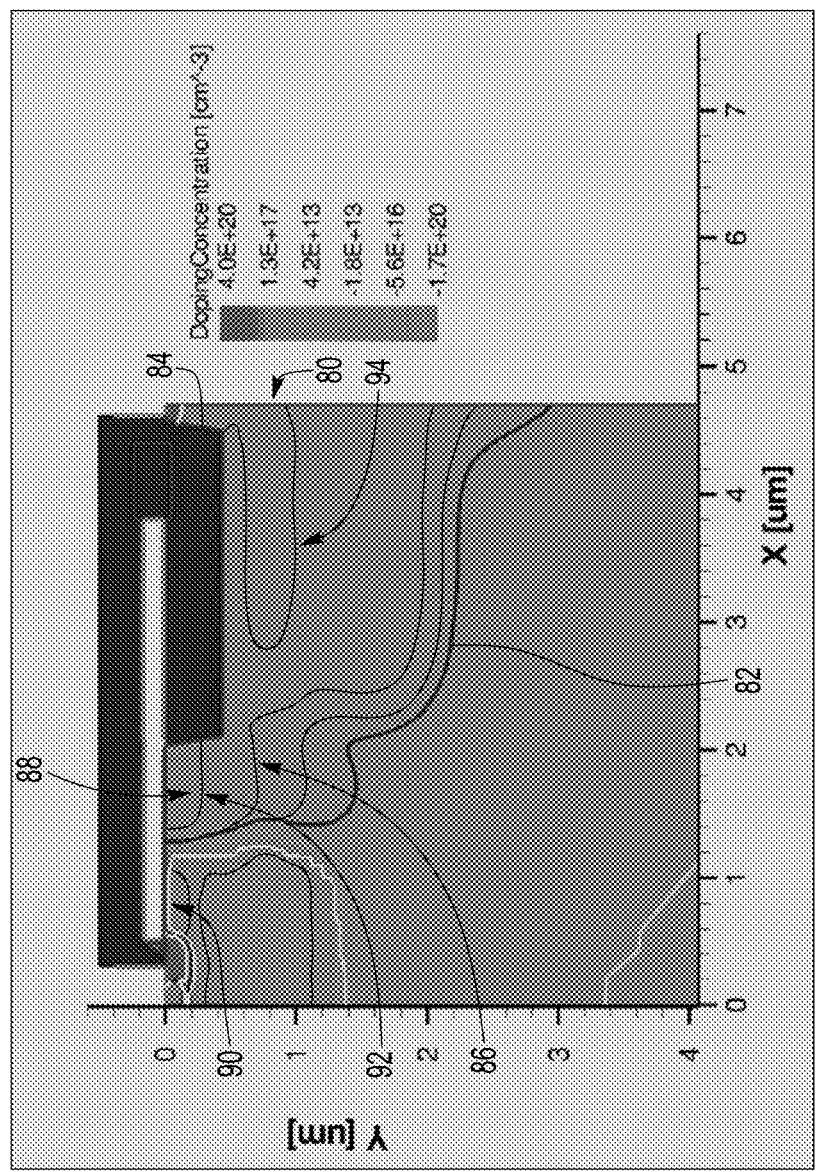
FIG. 6 is a cross-sectional, schematic view of simulated dopant concentration levels in an exemplary composite drift region.
Figure 7:
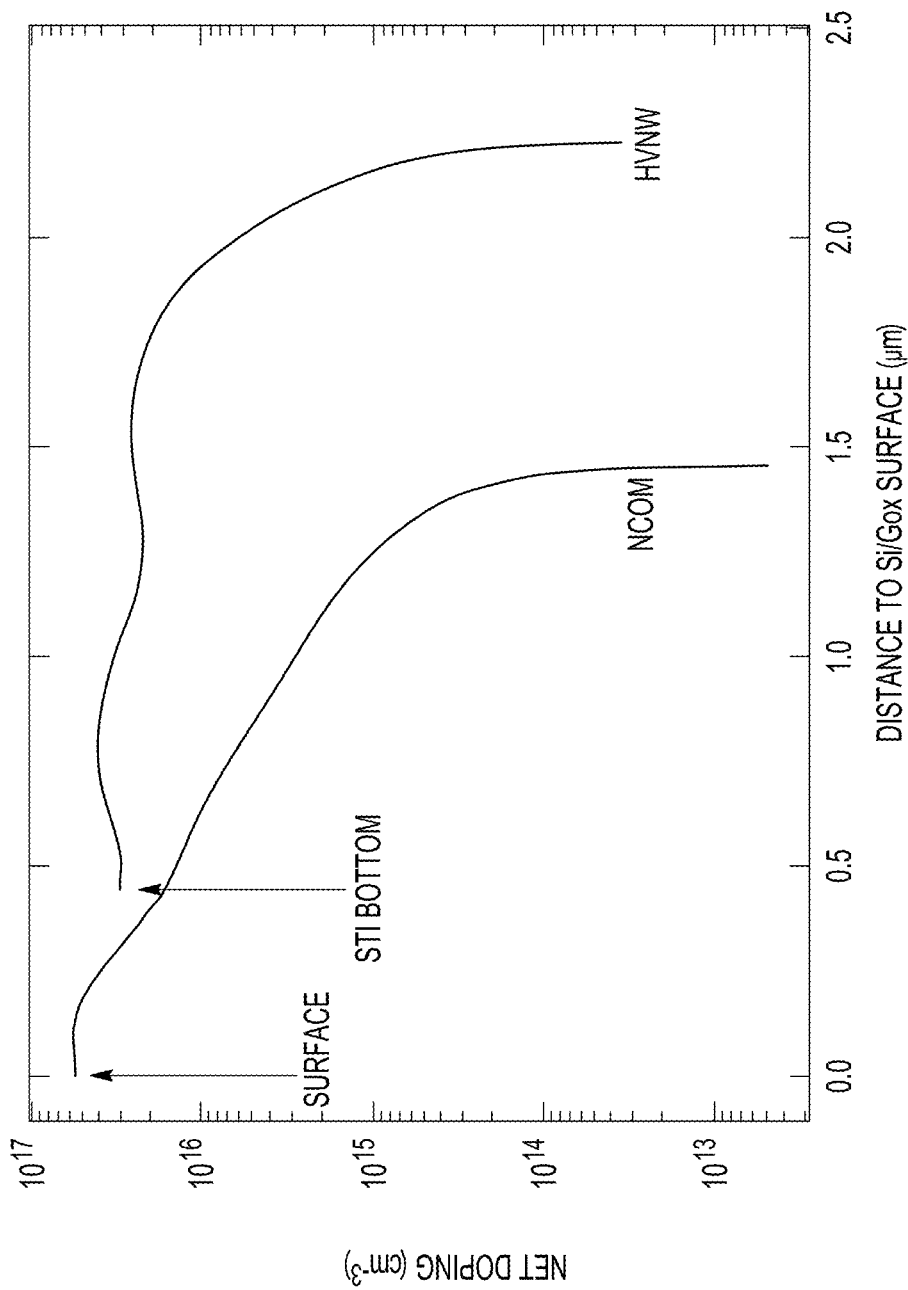
FIG. 7 is a graphical plot of simulated dopant concentration levels as a function of depth in an exemplary composite drift region.

FIGS. 6 and 7 depict exemplary simulated dopant concentration levels for an exemplary LDMOS device having a composite or stacked drift region. The simulation data may be obtained via a TCAD simulation tool. In FIG. 6, a composite drift region 80 is shown relative to a PN junction 82 and a STI region 84. A first drift region 86 of the composite drift region 80 has a dopant concentration profile that ranges from approximately $5 \times 10^{16}/cm^3$ in a region 88 at or near a channel region 90 to $1\text{-}4 \times 10^{15}/cm^3$ in a region 92 at or near the connection to a second drift region 94. The concentration levels are more clearly shown in FIG. 7. In this example, the dopant concentration level of the second drift region 94 is approximately $3\text{-}4 \times 10^{16}/cm^3$. As shown in FIGS. 6 and 7, the dopant concentration level in the second drift region 94 is maintained through a greater depth or distance from the substrate, or gate oxide, surface. In this example, the concentration level is roughly constant through 2.0 microns. In contrast, the concentration level in the first drift region 86 begins to decrease at a depth of about 0.2 microns (shallower than the depth of the STI region 84).

The dopant concentrations, thicknesses, and other characteristics of the other above-described semiconductor regions in the semiconductor substrate 22 may vary. In one example, the above-referenced semiconductor regions may have the following approximate concentrations and thicknesses:

|  | Concentration | Thickness |
| --- | --- | --- |
| substrate 22: | $1 \times 10^{15}/cm^3$ | 10 μm |
| p-epi 24: | $1 \times 10^{15}/cm^3$ | 5 μm |
| substrate 26: | $1 \times 10^{20}/cm^3$ | not applicable |
| body 32: | $1 \times 10^{17}/cm^3$ | 3 μm |
| source 36: | $1 \times 10^{21}/cm^3$ | 0.25 μm |
| drain 38: | $1 \times 10^{21}/cm^3$ | 1.0 μm |
| STI 46: | not applicable | 0.35 μm |

The concentrations and thicknesses may be different in other embodiments. The concentration may vary considerably in some regions between embodiments, including, for instance, the original substrate 26.

Figure 8:
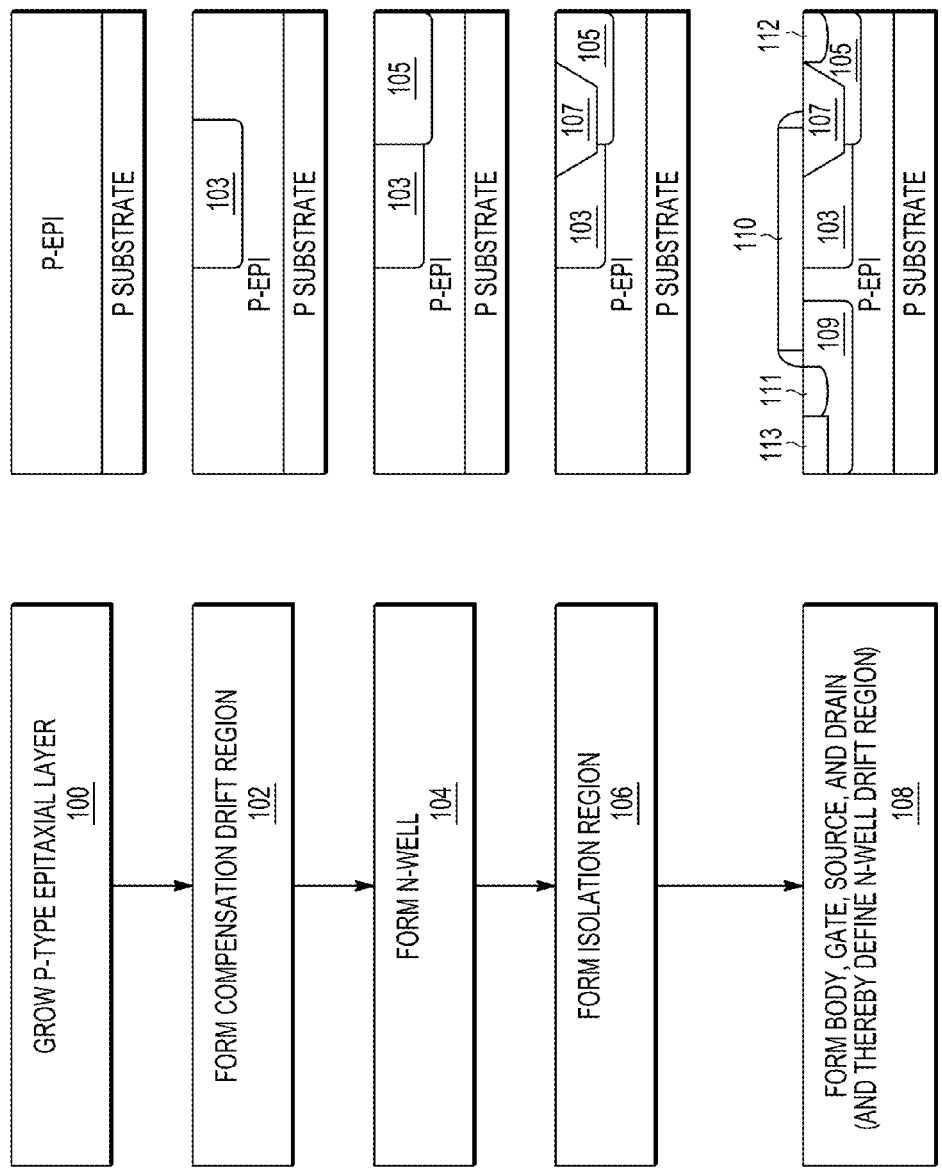
FIG. 8 is a flow diagram of an exemplary fabrication sequence to construct an re-channel LDMOS transistor with a composite drift region in accordance with one embodiment.

FIG. 8 shows an exemplary fabrication method for fabricating a device with a composite or stacked drift region as described above. The method may be directed to fabricating a reduced surface field (RESURF) transistor having one or more of the features described above. The transistor is fabricated with a semiconductor substrate, the regions or layers of which may have the conductivity types of the n-channel examples described above, or be alternatively configured to support a p-channel device. The method includes a sequence of acts, only the salient of which are depicted for convenience in illustration. The ordering of the acts may vary in other embodiments. The fabrication method is not limited to any particular doping mechanism, and may include future developed doping techniques.

The method may begin with, or include, an act 100 in which a p-type epitaxial layer (p-epi) is grown on a heavily doped p-type semiconductor substrate. In some cases, the act 100 includes the formation via, e.g., ion implantation, of one or more barrier layers in the epitaxial layer. The barrier layer may be configured via a mask to extend across an active area of the RESURF transistor. In some cases, the act 100 includes the growth of another p-type epitaxial layer. Any number of epitaxial layers may be grown.

In act 102, an n-type region 103 is formed in the epitaxial layer. The n-type region 103 may correspond with a first drift region of the composite drift region of the device. In one example, the n-type region 103 is formed via an ion implantation procedure configured via a mask dedicated to the formation of the first drift region. The mask may have an opening that overlaps a gate area of the device, as well as an area in which one or more other regions of the composite drift region are to be formed. The ion implantation procedure may be configured to establish a non-uniform dopant concentration profile as described above. The resulting dopant concentration profile decreases from a first level at a first depth to a second level at a second depth deeper than the first depth. The ion implantation procedure may be combined with a diffusion process to modify the dopant distribution after the dopant ions are implanted. The ion implantation procedure may be configured to establish a dopant concentration at or near a bottom of the n-type region 103 that overcomes the opposite dopant concentration of the epitaxial layer in which the n-type region 103 is formed.

In act 104, an additional n-type region 105 is formed in the epitaxial layer via another implantation procedure. The additional n-type region may correspond with a second drift region of the composite drift region. The n-type region 106 may be connected to the n-type region 103 and otherwise configured in a manner similar to the n-type well labeled "HVNW" in FIG. 1. For instance, the n-type region 105 has a dopant concentration level higher than the second level of the dopant concentration profile of the n-type region 103. The n-type regions 103 and 105 formed in acts 102 and 104 may be formed via respective, dedicated ion implantation procedures, the order of which may vary. Thus, in some cases, the formation of the second drift region is implemented before formation of the first drift region.

In act 106, an STI region 107 is formed in the substrate. The STI region 107 may be formed via any now known or hereafter developed procedure. For example, the act 106 may include the formation of a trench and the deposition (e.g., chemical vapor deposition, or CVD) of one or more materials in the trench. In some embodiments, the trench is filled with silicon oxide. Additional or alternative materials may be deposited. In an alternative embodiment, the STI region 107 is formed before the n-well.

The fabrication process may then include one or more procedures collectively shown in act 108. The procedures may be implemented in various orders. Additional or alternative procedures may be implemented. In one example, a p-type well 109 is formed to define the device body. An ion implantation procedure may be used. A gate structure 110 may then be formed. Source and drain regions 111, 112 may then be formed, using the gate structure for self-alignment, and via one or more n-type ion implantation procedures. For example, formation of one or both of the source region 111 and the drain region 112 may include a moderate implant before formation of sidewall spacers of the gate structure 110 to create one or more transition regions (see, e.g., FIG. 1). A heavy implant after formation of the sidewall spacers may then be implemented to form the source and/or drain regions 111, 112 adjacent to such transition regions. A heavily doped p-type contact region 113 for the device body may be formed in the p-type well 109 via a separate ion implantation procedure.

Additional acts may be implemented at various points during the fabrication procedure. For example, one or more acts may be directed to defining an active area of the device. In some cases, such acts may include the formation of a device isolation well. One or more metal layers may be deposited.

The embodiments described above include devices and methods of fabricating devices having a stacked or composite drift region to realize a higher breakdown voltage and lower drain-source resistance. The table below provides simulation data for three examples of the disclosed devices. The data specifies the breakdown voltage (BVDSS) and drain-source resistance (Rdson) over a given device area (A) for several exemplary drift lengths. The simulation data for the above-described devices is presented by comparison with (i) a traditional field drift LDMOS device having a single n-type well adjacent the device body and (ii) an LDMOS device with a single n-type well spaced from the device body pulled under an STI region. For each drift length, the LDMOS with the stacked drift region achieves the highest breakdown voltage without any or minimal increase in drain-source resistance.

| LDMOS Drift Type | 0.9 μm Drift Length | | 1.5 μm Drift Length | | 2.5 μm Drift Length | |
|---|---|---|---|---|---|---|
| | BVDSS (V) | Rdson* A (mΩ * mm$^2$) | BVDSS (V) | Rdson* A (mΩ * mm$^2$) | BVDSS (V) | Rdson* A (mΩ * mm$^2$) |
| Traditional | 49.6 | 42.1 | 53.0 | 55.3 | 56.4 | 77.7 |
| Under STI | 54.5 | 87.7 | 70.0 | 214.6 | 93.7 | 266.1 |
| Stacked | 55.3 | 36.0 | 71.1 | 52.1 | 95.6 | 80.8 |

The disclosed devices may include a drift region with a region or layer having a delta-like doping profile configured to compensate for the opposite conductivity type of the substrate (or epitaxial layer thereof). The compensation region or layer is stacked on and/or adjacent to another region or layer through which charge carriers drift during operation, the lateral extent of which is pulled back from the channel of the device and, for instance, under an STI region. The combination of the compensation region and the other drift region may maximize or increase the supporting voltage dropped in the drift region of the device. The breakdown voltage (BVDSS) may be increased accordingly at the same time a low drain-source resistance (Rdson) is maintained, thereby avoiding the typical trade-off between the two device parameters.

In a first aspect, a device includes a semiconductor substrate, a body region in the semiconductor substrate having a first conductivity type and a channel region, a composite drift region in the semiconductor substrate, having a second conductivity type, and including a first drift region and a second drift region spaced from the channel region by the first drift region, and a drain region in the semiconductor substrate, spaced from the channel region by the composite drift region, and having the second conductivity type. The first drift region has a dopant concentration profile with a first concentration level where adjacent the channel region and a second concentration level where adjacent the second drift region, the first concentration level being higher than the second concentration level.

In a second aspect, an electronic apparatus includes a substrate and a transistor disposed in the substrate. The transistor includes a first semiconductor region having a first conductivity type, second and third semiconductor regions having a second conductivity type, disposed above the first semiconductor region, and between which a voltage is applied during operation, a fourth semiconductor region having the first conductivity type, disposed between the second and third semiconductor regions, and having a conduction region through which charge carriers flow between the second and third semiconductor regions during operation, and fifth and sixth semiconductor regions having the second conductivity type and in which the charge carriers drift between the third and fourth semiconductor regions under the applied voltage, the fifth semiconductor region being spaced from the third semiconductor region by the sixth semiconductor region. The fifth semiconductor region has a dopant concentration profile with a first concentration level where adjacent the conduction region of the fourth semiconductor region and a second concentration level where adjacent the sixth semiconductor region, the first concentration level being higher than the second concentration level.

In a third aspect, a method of fabricating a transistor includes forming a first drift region of the transistor in a substrate, the substrate having a first conductivity type and the first drift region having a second conductivity type and a dopant concentration profile that decreases from a first level at a first depth to a second level at a second depth deeper than the first depth, and forming a second drift region of the transistor in the substrate, the second drift region having the second conductivity type, and being connected to the first drift region at the second depth. The second drift region has a dopant concentration level higher than the second level of the dopant concentration profile of the first drift region.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A device comprising:
a semiconductor substrate;
a body region in the semiconductor substrate having a first conductivity type and a channel region;
a composite drift region in the semiconductor substrate, having a second conductivity type, and comprising a first well and a second well spaced from the channel region by the first well; and
a drain region in the semiconductor substrate, spaced from the channel region by the composite drift region, and having the second conductivity type;
wherein the first well has a dopant concentration profile with a first concentration level at a surface of the semiconductor substrate where the first well is adjacent the channel region and a second concentration level where the first well is adjacent the second well, the first concentration level being higher than the second concentration level; and
wherein the first and second wells are connected with one another where the first well has the second concentration level, and not connected with one another where the first well has the first concentration level.

2. The device of claim 1, wherein the first well is spaced from the drain region by the second well.

3. The device of claim 1, wherein the first well has a bottom shallower than a bottom of the second well.

4. The device of claim 1, wherein the second concentration level is at a bottom of the first well at which the first and second wells are connected to one another.

5. The device of claim 1, further comprising an isolation region in the semiconductor substrate around which charge carriers drift through the first and second wells, and wherein the first and second wells are connected to one another under the isolation region.

6. The device of claim 1, wherein the dopant concentration profile decreases with increasing depth of the first well.

7. The device of claim 1, wherein the second concentration level and a dopant concentration level of a layer of the semiconductor substrate in which the composite drift region is disposed have a common order of magnitude.

8. The device of claim 1, wherein the second well has a dopant concentration level higher than the second concentration level.

9. The device of claim 1, wherein the first concentration level is more than one order of magnitude higher than the second concentration level.

10. The device of claim 1, further comprising an isolation region in the semiconductor substrate around which charge carriers drift through the first and second wells, and wherein the second well is a buried region under the isolation region.

11. The device of claim 10, wherein the first well has a bottom deeper than the isolation region.

12. The device of claim 1, wherein the dopant concentration profile of the first well has a delta-like shape.

13. The device of claim 1, wherein the second well has a dopant concentration level lower than the first concentration level and higher than the second concentration level.

14. An electronic apparatus comprising:
a substrate; and
a transistor disposed in the substrate, the transistor comprising:
a first semiconductor region having a first conductivity type;

second and third semiconductor regions having a second conductivity type, disposed above the first semiconductor region, and between which a voltage is applied during operation;
a fourth semiconductor region having the first conductivity type, disposed between the second and third semiconductor regions, and having a conduction region through which charge carriers flow between the second and third semiconductor regions during operation; and
first and second wells having the second conductivity type and in which the charge carriers drift between the third and fourth semiconductor regions under the applied voltage, the second well being spaced from the third semiconductor region by the first well;
wherein the first well has a dopant concentration profile with a first concentration level at a surface of the substrate where the first well is adjacent the conduction region of the fourth semiconductor region and a second concentration level where the first well is adjacent the second well, the first concentration level being higher than the second concentration level; and
wherein the first and second wells are connected with one another where the first well has the second concentration level, and not connected with one another where the first well has the first concentration level.

15. The electronic apparatus of claim 14, wherein the first well has a bottom shallower than a bottom of the second well.

16. The electronic apparatus of claim 14, wherein the second concentration level is at a bottom of the first well at which the first and second wells are connected to one another.

17. The electronic apparatus of claim 14, further comprising an isolation region around which charge carriers drift through the first and second wells, and wherein the first and second wells are connected to one another under the isolation region.

18. The electronic apparatus of claim 14, wherein the dopant concentration profile decreases with increasing depth of the first well.

* * * * *